United States Patent [19]
Hakozaki et al.

[11] Patent Number: 5,708,600
[45] Date of Patent: Jan. 13, 1998

[54] METHOD FOR WRITING MULTIPLE VALUE INTO NONVOLATILE MEMORY IN AN EQUAL TIME

[75] Inventors: Kenji Hakozaki, Tenri; Shinichi Sato, Nara; Takuji Tanigami, Kitakatsuragi-gun, all of Japan

[73] Assignee: Sharp Kabushiki Kaisha, Osaka, Japan

[21] Appl. No.: 725,661

[22] Filed: Oct. 1, 1996

[30] Foreign Application Priority Data

Feb. 1, 1996 [JP] Japan .................... 8-016469

[51] Int. Cl.$^6$ .................................... G11C 16/02
[52] U.S. Cl. .................. 365/185.03; 365/185.18; 365/185.19; 365/185.27
[58] Field of Search .............. 365/185.03, 185.18, 365/185.19, 185.27, 185.28

[56] References Cited

U.S. PATENT DOCUMENTS

| | | | |
|---|---|---|---|
| 5,043,940 | 8/1991 | Harari | 365/185.03 |
| 5,521,865 | 5/1996 | Ohuchi et al. | 365/185.03 |
| 5,594,685 | 1/1997 | Bergemont et al. | 365/185.03 |

FOREIGN PATENT DOCUMENTS 6-177397  6/1994  Japan .

OTHER PUBLICATIONS

H. Onda et al, "A Novel Cell Structure Suitable for a 3 Volt Operation, Sector Erase Flash Memory" IEDM Tech. Digest 1992, pp. 599–602.

Hitoshi Kume, "A 1.28μm$^2$ Contactless Memory Cell Technology for a 3V–Only 64 Mbit and Future Flash Memories" IEDM Tech. Digest 1993, pp. 19–22.

Yosiaki S. Hisamune, "A High Capacitive–Coupling Ratio (HiCR) Cell for 3 V–Only 64 Mbit and Future Flash Memories" IEDM Tech. Digest 1993, pp.19–22.

H. Shirai, et al, "A 0.54μm$^2$ Self–Aligned, HSG Floating Gate Cell (SAHF Cell) for 256Mbit Flash Memories", IEEE, 1995, pp. 653–656.

S. Ueno et al, "Optimum Votage Scaling Methodology for Low Voltage Operation of CHE type Flash EEPROMs with High Reliability, Maintaining the Constant Performance", 1996 Symposium on VLSI Technology Digest of Technical Papers, IEEE, 1996, pp. 54–55.

*Primary Examiner*—Son T. Dinh
*Attorney, Agent, or Firm*—Nixon & Vanderhye, P.C.

[57] ABSTRACT

There is provided a method for writing a multiple value into a nonvolatile memory capable of writing multiple value data into a floating gate type memory cell in an equal time even when the data are varied. With a specified voltage applied to a control gate of a memory cell, a drain voltage which is varied according to each of data values "11", "10" and "01" to a drain so that a write time required for setting a varied threshold voltage is equalized. By moving electrons between a floating gate and a drain through a gate insulating film, the threshold voltage of the memory cell is set.

8 Claims, 3 Drawing Sheets

METHOD FOR WRITING MULTIPLE VALUE INTO NONVOLATILE MEMORY IN AN EQUAL TIME

BACKGROUND OF THE INVENTION

1. Field of the Invention

The present invention relates to a method for writing a multiple value into a nonvolatile memory. In particular, the present invention relates to a method for writing data which takes not less than three different values (referred to as "multiple data" hereinafter) into a floating gate type memory cell constituting an electrically erasable programmable read only memory (EEPROM).

2. Description of the Prior Art

FIG. 4 shows an EEPROM capable of electrically writing and erasing data therein, or in particular, a flash EEPROM (referred to as a "flash memory" hereinafter) capable of collectively erasing data. The flash EEPROM of FIG. 4 includes a memory cell M constructed by providing a source (n-type region) S and a drain (n-type region) D on a surface of a semiconductor substrate 1. In addition, there is provided, in order, a gate insulating film 2, a floating gate FG, an interlayer insulating film 3, and a control gate CG on a channel region (p-type region) Ch between the source S and the drain D.

There has recently been proposed a multiple value writing method for writing a multiple value by applying a voltage corresponding to an input data to the drain D when writing data into such a memory cell M (Japanese Patent Laid-Open Publication No. HEI 6-177397). As shown in FIG. 5, the memory cell M can take threshold voltages of 2 V, 3 V, 4 V and 5 V at four levels in correspondence with four-value data of "00" to "11" according to the binary code. For example, when writing the data "11" into the memory cell M, a high voltage of about 12 V to 15 V is applied to the control gate CG shown in FIG. 4, the drain D is made to have 0 V (grounded) according to the data "11", and the source S is opened to be put in a floating state. By this operation, electric charges corresponding in amount to a potential difference between the control gate CG and the drain D are injected to the floating gate FG, so that the threshold Voltage of the memory cell M is set to 5 V. When writing data "10" into the memory cell M, the control gate CG and the source S are put in the same states as above, and a voltage of 1 V is applied to the drain D according to the data "10". By this operation, electric charges corresponding in amount to the potential difference between the control gate CG and the drain D are injected into the floating gate FG, so that the threshold voltage of the memory cell M is set to 4 V. Likewise, the threshold voltage is set to 3 V by setting the drain voltage to 2 V according to data "01", and the threshold voltage is set to 2 V by setting the drain voltage to 3 V according to data "00". The above document (Japanese Patent Laid-Open Publication No. HEI 6-177397) has also proposed a method for providing the drain voltage as a pulse voltage and varying the pulse height or pulse width of the voltage to thereby vary the threshold voltage. Further, it has proposed a writing method for using a Fowler-Nordheim tunneling method.

However, according to the above-mentioned multiple value writing method, it is unclear what sort of pulse width of the drain voltage is applied in correspondence with each of the data "00" through "11", and the time required for writing each input data is not uniform. For the above reasons, even in the case of a memory cell connected to an identical word line, when the data value to be written is varied, the write operation must be executed independently of each data value in a such a manner that "01" is written firstly, and it is followed by "10" and then by "11", which problematically results in such a increased overall write time.

When the Fowler-Nordheim tunneling method is used for the write operation, there is generated an about tenfold deviation in the write time even under identical voltage application conditions due to a variation in manufacturing memory cells. Therefore, in order to make the threshold voltages of the memory cells fall within a range of about 1 V after the write operation, a fine verify operation (check of the threshold voltage) is required, and this also causes the problem that the write time increases as a whole.

SUMMARY OF THE INVENTION

The object of the present invention is therefore to provide a method for writing a multiple value into a nonvolatile memory capable of executing the write operation in an equal time even when the data value is varied in writing multiple value data into a floating gate type memory cell.

Another object of the present invention is to provide a method for writing a multiple value into a nonvolatile memory capable of collectively writing multiple value data into a plurality of memory cells connected to an identical word line, thereby allowing the write time to be reduced as a whole. Still another object of the present invention is to provide a method for writing a multiple value into a nonvolatile memory capable of making the threshold voltages of memory cells fall within a narrow range with high accuracy in writing multiple value data into a plurality of memory cells, executing the write operation with fewer times of verify operation, and allowing the write time to be reduced.

In order to achieve the aforementioned object, there is provided a method for writing a multiple value into a nonvolatile memory comprising the step of: writing data which take not less than three different values as threshold voltages varied according to each of the data values into a memory cell which has a gate insulating film, a floating gate, an interlayer insulating film and a control gate in order on a channel region between a source and a drain formed on a surface of a semiconductor substrate, wherein by applying a drain voltage varied according to each of the data values to the drain so that a write time required for setting the varied threshold voltage is equalized with a specified voltage applied to the control gate, and thereby moving electrons between the floating gate and the drain through the gate insulating film, the threshold voltage of the memory cell is set.

According to the method for writing a multiple value into a nonvolatile memory of the present invention, the drain voltage varied according to each data value is applied to the drain so that a write time for setting the threshold voltage varied according to each data value into the memory cell is equalized. Therefore, even when the data value is varied in writing a multiple value data into a plurality of memory cells, the data can be written in an equal time. Therefore, different data values can be simultaneously collectively written into the plurality of memory cells, thereby allowing the write time to be reduced as a whole. Furthermore, since each data value can be written in an equal time even when the data value is thus varied, the threshold voltage of the memory cell after the write operation can be checked by a simple verify method similarly to the case where a binary data is written. Therefore, the write time can be further reduced as a whole.

According to a method for writing a multiple value into a nonvolatile memory of one embodiment, the voltage applied to the control gate is a negative voltage, the drain voltage is a positive voltage, and the threshold voltage of the memory cell is set by discharging electrons from the floating gate to the drain through the gate insulating film by a Fowler-Nordheim tunneling method.

According to the method for writing a multiple value into a nonvolatile memory of this embodiment, the negative voltage is applied to the control gate. Therefore, when the memory cell is the general n-channel type, no depletion layer expands in the p-type channel region (substrate or well). Therefore, in the case where the drain voltage is set, for example, within a range of 0 to 4.5 V, there is such an advantage that the write operation is executed sufficiently even when the voltage to be applied to the control gate (referred to properly as a "control gate voltage" hereinafter) is about −10 V (even when the absolute value of the voltage is 10 V at most). Conversely, in the case where the threshold voltage of the memory cell is set by applying a positive voltage to the control gate and injecting electrons from the drain into the floating gate through the insulating film, a depletion layer expands in the p-type channel region (substrate or well) when the memory cell is the general n-channel type. As a result, an electric field exerted on the gate insulating film is weakened, and therefore, the control gate voltage is required to be set high up to about 12 to 15 V (refer to the prior art).

According to a method for writing a multiple value into a nonvolatile memory of one embodiment, assuming that a threshold voltage Vth to be set in the memory cell is numbered with n=0, 1, 2, . . . in order from a lowest threshold voltage, then a drain voltage Vd(n) when writing data corresponding to the n-th threshold voltage Vth(n) is obtained from the following equation:

$$Vd(n)=Vd(0)-n \cdot \Delta Vth \cdot GCR/(1-DCR) \quad (1)$$

where $\Delta Vth=Vth(n+1)-Vth(n)$, $GCR=Cono/Ctot$, $DCR=Cd/Ctot$, $Ctot=Cono+Ctd+Cd+Cs$, Cono is an electrostatic capacity between the floating gate and the control gate, Ctd is an electrostatic capacity between the floating gate and the channel region, Cd is an electrostatic capacity between the drain and the floating gate, and Cs is an electrostatic capacity between the source and the floating gate, then by applying a negative voltage to the control gate, putting the source into a floating state, applying a positive drain voltage Vd(n) obtained by the equation (1) according to a data value to be written, and thereby discharging electrons from the floating gate to the drain by the Fowler-Nordheim tunneling method, the threshold voltage Vth(n) of the memory cell is set.

According to the method for writing a multiple value into a nonvolatile memory of this embodiment, the drain voltage obtained by the equation (1) is to equalize the write time required for setting a varied threshold voltage corresponding to each data value into the memory cell as follows.

The equation (1) will be described below. It is postulated that data which takes n different values are written while being set as different threshold voltages corresponding to the data values. It is to be noted that the threshold voltage means a voltage with which the channel starts to be turned on when the threshold voltage is applied to the control gate at a read time. It is further postulated that a threshold voltage Vth to be set in the memory cell is numbered with n=0, 1, 2, . . . in order from the lowest threshold voltage, thereby providing that n-th threshold voltage is expressed by Vth(n) and a drain voltage when writing data corresponding to the threshold voltage Vth(n) is expressed by Vd(n).

(1) As shown in FIG. 4, it is provided that an electrostatic capacity between the floating gate and the control gate is represented by Cono, an electrostatic capacity between the floating gate and the channel region is represented by Ctd, an electrostatic capacity between the drain and the floating gate is represented by Cd, and an electrostatic capacity between the source and the floating gate is Cs, and it is further provided that $GCR=Cono/Ctot$, $DCR=Cd/Ctot$, $SCR=Cs/Ctot$, and $Ctot=Cono+Ctd+Cd+Cs$.

In this model, it is known that a floating gate potential Vfg is expressed by the following equation (2).

$$Vfg=Qfg/Ctot+GCR \cdot Vcg+SCR \cdot Vs+DCR \cdot Vd \quad (2)$$

where

Qfg represents the quantity of electric charge in the floating gate,

Vcg represents the electric potential of the control gate,

Vd represents the electric potential of the drain, and

Vs represents the electric potential of the source.

(2) A memory cell whose threshold voltage is Vth(n) and a memory cell whose threshold voltage is Vth(n+1) are now considered. Electric charges of Qfg(n) exist in the floating gate of the memory cell whose threshold voltage is Vth(n), while electric charges of Qfg(n+1) exist in the floating gate of the memory cell whose threshold voltage is Vth(n+1).

The threshold voltage is the voltage with which the channel starts to be turned on when it is applied to the control gate at the read time. Therefore, assuming that the electric potential Vcg of the control gates of both the memory cells takes Vth(n) and Vth(n+1) respectively (provided that the drain voltages Vd and the source voltages Vs of both the memory cells are equal in correspondence), both the memory cells are each put into the state in which the channel starts to be turned on. In this stage, it can be said that the floating gate potentials Vfg(n) and Vfg(n+1) of both the memory cells are equal to each other.

That is, by substituting Vth(n) and Vth(n+1) into Vcg in the equation (2), Vth(n) and Vth(n+1) are respectively expressed by:

$$Vfg(n)=Qfg(n)/Ctot+GCR \cdot Vth(n)+SCR \cdot Vs+DCR \cdot Vd \quad (3)$$

and $$Vfg(n+1)=Qfg(n+1)/Ctot+GCR \cdot Vth(n+1)+SCR \cdot Vs+DCR \cdot Vd \quad (4)$$

where both are equal to each other, and therefore, a relational expression:

$$(Qfg(n)-Qfg(n+1))/Ctot=GCR(Vth(n+1)-Vth(n)) \quad (5)$$

can be obtained.

(3) Then, it is assumed that drain voltages Vd(n) and Vd(n+1) are applied to the respective drains for T seconds with the control gate voltage (Vcg) fixed to consequently obtain the threshold voltages Vth(n) and Vth(n+1). In this case, the potential difference between the floating gate and the drain after the application of the voltages for T seconds is identical, and therefore, the following equation (6) holds.

$$Vd(n)-Vfg(n)=Vd(n+1)-Vfg(n+1) \quad (6)$$

Further, the electric potentials of the floating gates when the drain voltages Vd(n) and Vd(n+1) are applied to the respective drains for T seconds with the control gate voltage (Vcg) fixed and the sources opened to be put into the floating state are expressed by:

$$Vfg(n)=Qfg(n)/Ctot+GCR \cdot Vcg+DCR \cdot Vd(n) \quad (7)$$

and $$Vfg(n+1)=Qfg(n+1)/Ctot+GCR \cdot Vcg+DCR \cdot Vd(n+1) \quad (8)$$

By substituting the equations (7) and (8) into the equation (6), there can be obtained a relational expression:

$$(1-DCR)(Vd(n)-Vd(n+1))=(Qfg(n)-Qfg(n+1))/Ctot \quad (9)$$

(4) From the equations (5) and (9), there can be obtained a relational expression:

$$Vth(n+1)-Vth(n)=(1-DCR)(Vd(n)-Vd(n+1))/GCR \quad (10)$$

where it is assumed that Vth(n+1)−Vth(n)=ΔVth, i.e., the difference between the threshold voltages is constant regardless of n, and the value is ΔVth. As a result, by summing up the respective members of n equations obtained by varying the value of n in the equation (10) in the manner of (n−1), (n−2), . . . , 0, an equation (1)

$$Vd(n)=Vd(0)-n \cdot \Delta Vth \cdot GCR/(1-DCR)$$

can be obtained.

According to this method for writing a multiple value into a nonvolatile memory, the write operation is executed by using the thus obtained drain voltage Vd(n). That is, the negative voltage is applied to the control gate, the source is put into the floating state, and the positive drain voltage Vd(n) obtained by the equation (1) according to the data value to be written is applied to the drain. Then, the threshold voltage Vth(n) of the memory cell is set by discharging electrons from the floating gate to the drain by the Fowler-Nordheim tunneling method.

With the above arrangement, the write time required for setting the threshold voltage Vth(n) (n=0, 1, 2, . . . ) varied according to each data value into the memory cell is equalized. Therefore, even when the data value is varied in writing a multiple value data into a plurality of memory cells, the data can be written in an equal time. Therefore, the different data values can be simultaneously collectively written into the plurality of memory cells, thereby allowing the write time to be reduced as a whole. Furthermore, since the data values can be written in an equal time even when the data value is thus varied, the threshold voltage of the memory cell after the write operation can be checked by a simple verify method similarly to the case where a binary data is written. Therefore, the write time can be further reduced as a whole.

According to a method for writing a multiple value into a nonvoltile memory of one embodiment, the memory cells are arranged in a matrix form on the semiconductor substrate, a word line is connected to the control gates of the memory cells arranged in the direction of row, and a bit line is connected to the drains of the memory cells arranged in the direction of column, and the specified voltage is applied to the word line connected to a plurality of memory cells into which data are to be written out of a plurality of word lines, the drain voltage corresponding to a data value to be written into each of the plurality of memory cells is applied to the bit line connected to the memory cells, thereby writing the data simultaneously into the plurality of memory cells connected to each identical word line.

According to the method for writing a multiple value into a nonvolatile memory of this embodiment, the multiple value data can be written into the plurality of memory cells connected to an identical word line. Therefore, the write time can be reduced as a whole.

According to the method for writing a multiple value into a nonvolatile memory of one embodiment, the negative voltage to be applied to the control gate or the word line is comprised of a plurality of pulses whose voltage level reduces gradually.

According to the method for writing a multiple value into a nonvolatile memory of this embodiment, the threshold voltage is verified each time one pulse of the negative voltage is applied to the control gate or the word line. When the write operation is insufficient as a consequence of the verify operation, the subsequent pulse having a lower level is applied. When the write operation is executed as desired, the pulse application can be stopped. Therefore, the threshold voltages of the memory cells can be made to fall within a narrow range with high accuracy in writing multiple value data into a plurality of memory cells, and the write operation can be executed with fewer times of verify operation, thereby allowing the write time to be further reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 2:
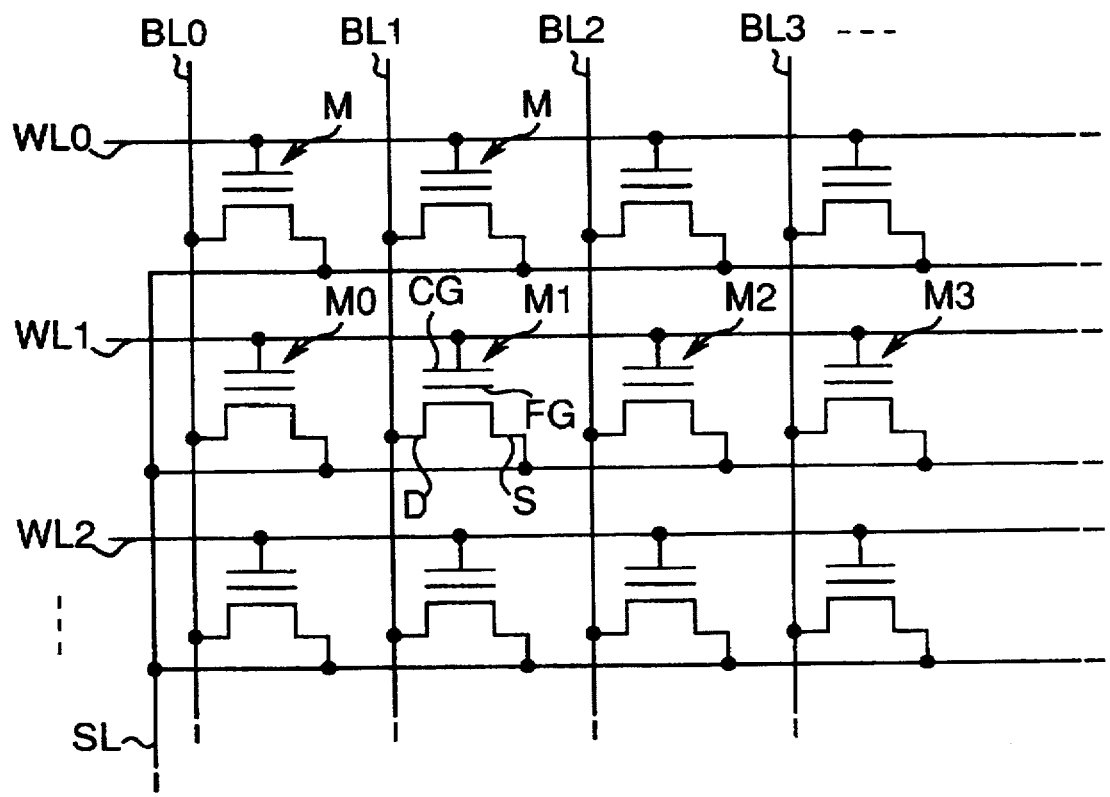
FIG. 2 is a schematic diagram showing the construction of a flash memory to be subjected to the write operation.

FIG. 2 shows a flash memory which serves as a nonvolatile memory to be an object into which multiple value data is written. This flash memory is provided by arranging floating gate type memory cells M in a matrix form on a semiconductor substrate. Word lines WL0, WL1, WL2, . . . are connected to the control gates CG of the memory cells M of each row, while bit lines BL0, BL1, BL2, . . . are connected to the drains D of the memory cells M of each column. Further, the sources S of the memory cells M are connected to a common source line SL. It is to be noted that the memory cells M connected to the word line WL1 are represented by M0, M1, M2, . . . so that they can be distinguished from one another.

Figure 4:
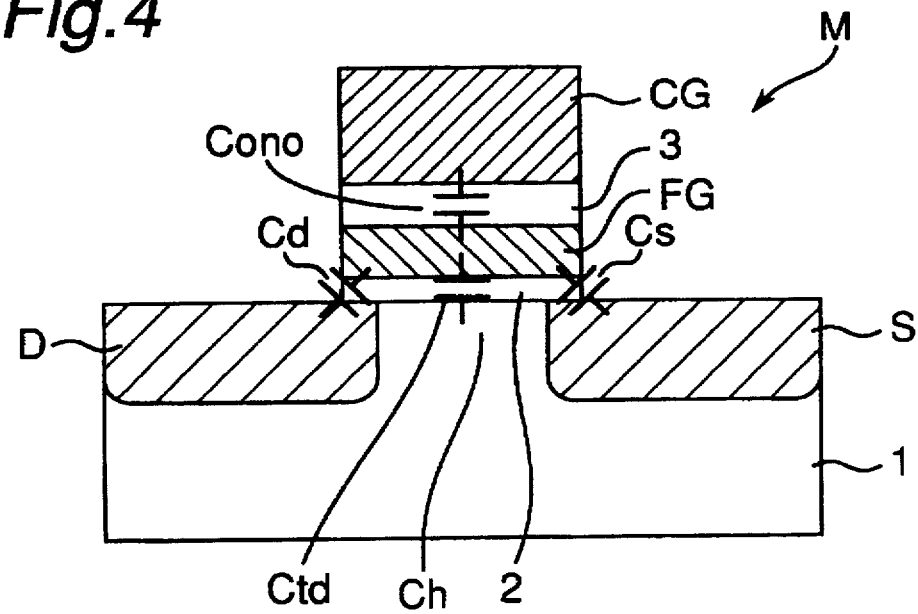
FIG. 4 is a diagram showing the structure of a floating gate type memory cell.
Figure 5:
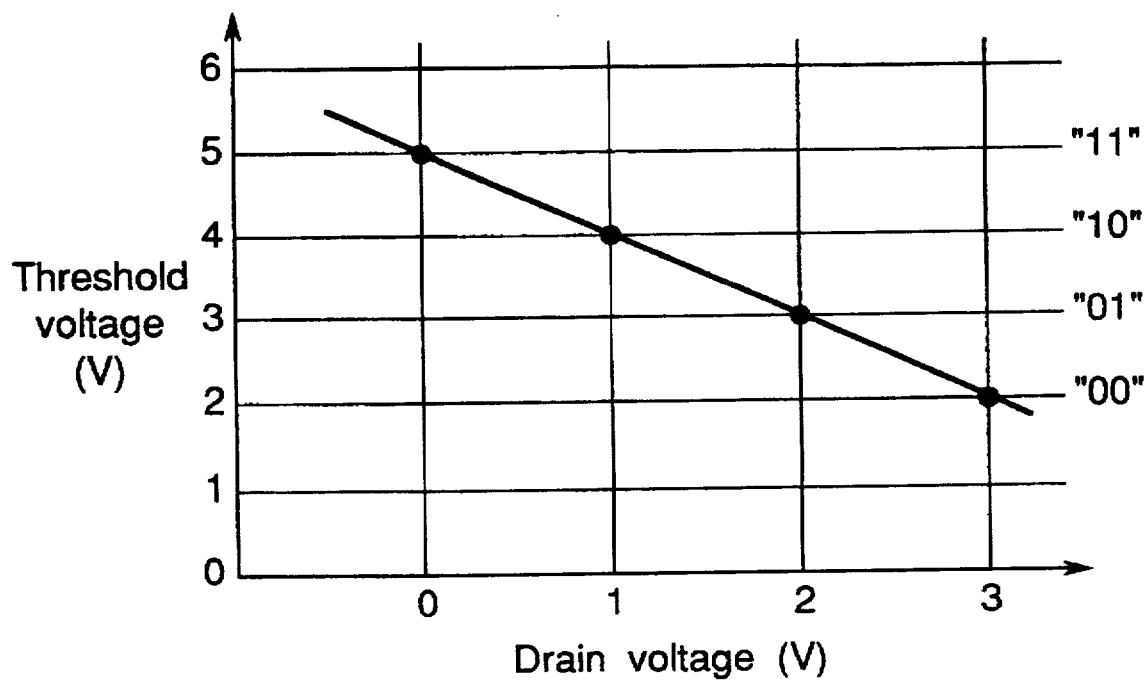
FIG. 5 is a graph showing a relation between a drain voltage and a threshold voltage according to a known reference document.

As shown in FIG. 4, each memory cell M is constructed by providing a source (n/type region) S and a drain (n-type region) D on a surface of a silicon substrate (or well) 1, and providing in order a gate insulating film 2 made of a silicon oxide film, a floating gate FG, an interlayer insulating film 3 made of a silicon oxide film and a silicon nitride film and a control gate CG on a channel region (p-type region) Ch between the source S and the drain D. The film thickness of the gate insulating film 2 is set to 95 Å, while the film thickness of the interlayer insulating film 3 is set to 150 Å in terms of the film thickness of the silicon oxide film. Each memory cell M is allowed to take a threshold voltage Vth at four levels in correspondence with four-value data of "00" to "11" according to the binary code as shown outside the frame of FIG. 1A. It is to be noted that the threshold voltage Vth means a voltage with which the channel starts to be turned on when the threshold voltage Vth is applied to the control gate CG at a read time. It is further postulated that the threshold voltage Vth is numbered with n=0, 1, 2, . . . in order from the lowest threshold voltage, thereby representing the threshold voltage Vth by Vth(0), Vth(1), Vth(2) and Vth(3). In this example, there are the correspondence that:

Vth(0)=1.0 V±0.5 V in regard to data "11",
Vth(1)=2.5 V±0.5 V in regard to data "10",
Vth(2)=4.0 V±0.5 V in regard to data "01", and
Vth(3)>5.0 V in regard to data "00".

There is provided a difference of ΔVth=1.5 V between the center value of Vth(0) and the center value of Vth(1) and between the center value of Vth(1) and the center value of Vth(2). Though Vth(3) is greater than 5.0 V, if the center value of Vth(3) is regarded as 5.5 V, a difference of ΔVth= 1.5 V can also be obtained between the center value of Vth(2) and the center value of Vth(3). For the sake of simplicity, Vth(0), Vth(1), Vth(2) and Vth(3) are represented by their respective center values in the description below.

Four-value data is written into the flash memory as follows.

(i) First, data "00" is written into all the memory cells M in the flash memory.

In order to write the data "00" a positive voltage of, for example, 11 V is applied to the control gate CG of each memory cell M through the word lines WL0, WL1, WL2, . . . shown in FIG. 2 and a negative voltage of, for example, −6 V is applied to the substrate (well) for a specified time. By this operation, electrons are injected into the floating gate FG from the channel region at all the memory cells M, thereby setting the threshold voltage Vth to Vth(3)>5.5 V corresponding to the data "00". The write operation of the data "00" may be executed in units of blocks comprised of a group of the memory cells M.

(ii) Then, except for the memory cell M into which the data "00" is to be written, the data "01", "10" and "11" are selectively written into the other memory cells M.

(1) First, drain voltages Vd(0), Vd(1) and Vd(2) used in writing the respective data "11", "10" and "01" corresponding respectively to the threshold voltages Vth(0), Vth(1) and Vth(2) are obtained by the following equation:

$$Vd(n)=Vd(0)-n\cdot\Delta Vth\cdot GCR/(1-DCR) \quad (1)$$

where

ΔVth=Vth(n+1)−Vth(n),
GCR=Cono/Ctot,
DCR=Cd/Ctot,
Ctot=Cono+Ctd+Cd+Cs,

Cono is an electrostatic capacity between the floating gate and the control gate, Ctd is an electrostatic capacity between the floating gate and the channel region, Cd is an electrostatic capacity between the drain and the floating gate, and Cs is an electrostatic capacity between the source and the floating gate.

In this case, between Vth(0), Vth(1) and Vth(2), there is the following relation:

$$\Delta Vth=Vth(1)-Vth(0)=Vth(2)-Vth(1)=1.5 \text{ V}$$

and here is used a memory cell in which

GCR=0.6 and
DCR=0.1.

Therefore, assuming that the control gate voltage Vcg=− 10 V and the drain voltage when the data "11" corresponding to the threshold voltage Vth(0) is written is Vd(0)=4.5 V, according to the equation (1), there hold the equations:

$$Vd(0)=Vd-0\cdot\Delta Vth\cdot GCR/(1-DCR)=4.5V,$$

$$Vd(1)=Vd-1\cdot\Delta Vth\cdot GCR/(1-DCR)=3.5V,$$

$$Vd(2)=Vd-2\cdot\Delta Vth\cdot GCR/(1-DCR)=2.5V,$$

(2) We consider a case where any one of the data "11", "10" and "01" is written into a memory cell M1 in which, for example, the control gate CG is connected to the word line WL1 and the drain D is connected to the bit line BL1. In this case, a negative voltage Vcg=−10 V is applied to the word line WL1, the source line SL is opened to put the source S of the memory cell M1 into the floating state, and the positive drain voltage Vd(0)=4.5 V, Vd(1)=3.5 V or Vd(2)=2.5 V obtained by the equation (1) according to the data values "11", "10" and "01" to be written is applied to the bit line BL1. It is to be noted that the unselected word lines WL0, WL2, . . . and the bit lines BL0, BL2, BL3, . . . having no relation with the memory cell M1 are each made to have 0 V.

By discharging electrons from the floating gate FG to the drain D of the specified memory cell M under the above voltage application conditions by the Fowler-Nordheim tunneling method, the threshold voltage Vth of the memory cell M1 is reduced. By this operation, the threshold voltage Vth of the memory cell M1 is set according to the data values "11", "10" or "01" to be written.

With the above arrangement, the negative voltage is applied to the control gate CG, and therefore, no depletion layer expands in the p-type channel region (substrate or well). Therefore, when the drain voltage Vd is set, for example, within a range of 0 to 4.5 V, the write operation can be executed sufficiently even when the control gate voltage Vcg is about −10 V (even when the absolute value of the voltage is 10 V at most).

Figure 1A:
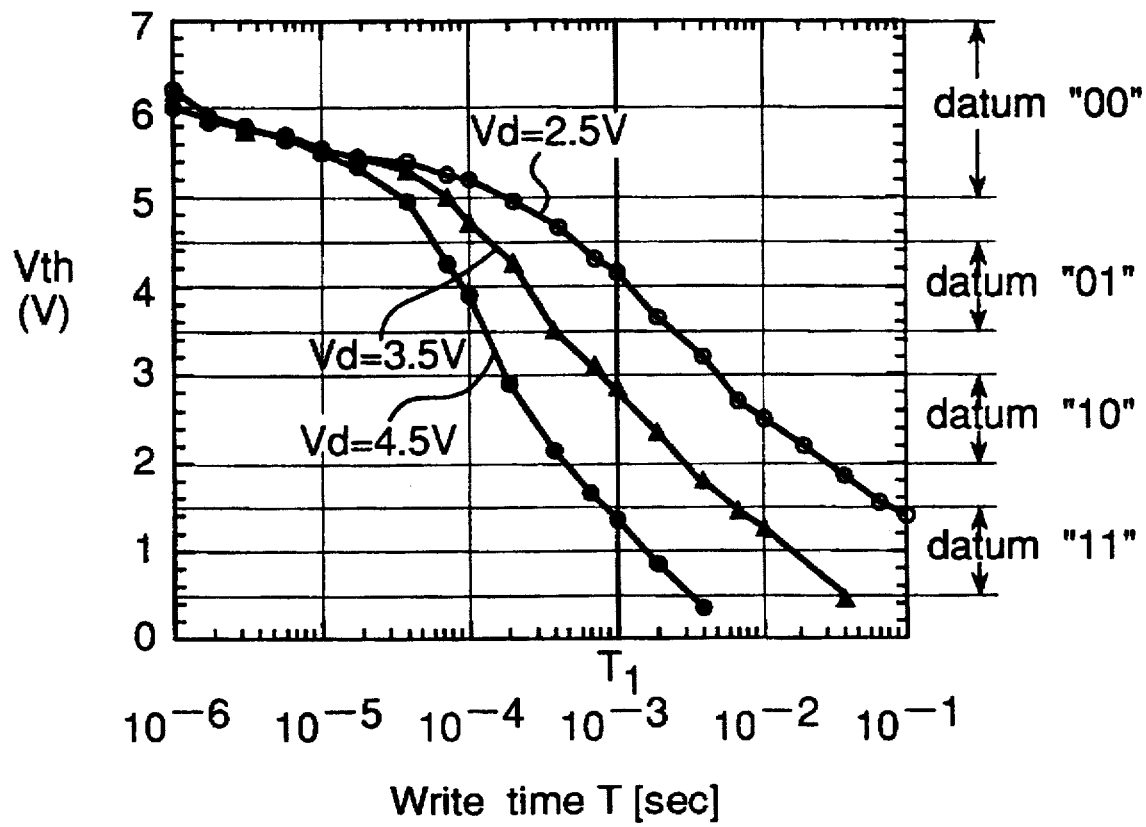
FIGS. 1A and 1B are respectively a graph showing the dependency of a threshold voltage Vth on a write time T and voltage application conditions at the time in a case where a write operation is effected on a floating gate type memory cell by a method for writing a multiple value into a nonvolatile memory according to an embodiment of the present invention.
Figure 1B:
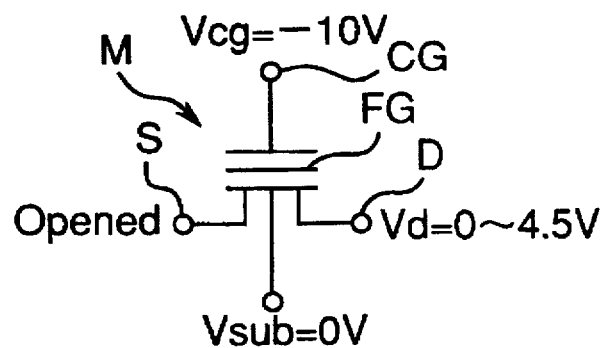

FIG. 1A shows a dependency of the threshold voltage Vth on write time T when the write operation is thus executed actually on a certain memory cell M (while FIG. 1B shows voltage application conditions of the memory cell M). As is apparent from FIG. 1A, the threshold voltage Vth of the memory cell M becomes the target threshold voltages Vth (0), Vth(1) and Vth(2) after the elapse of a time $T_1$=1 msec from the start of the write operation. That is, according to the present method for writing a multiple value, the time required for setting the different threshold voltages Vth(0), Vth(1) and Vth(2) corresponding to the data values "11", "10" and "01" into the memory cell M is equalized. Therefore, as described later, when writing the data "11", "10" and "01" into a plurality of memory cells M, the data can be written in the equal time $T_1$ even when the data value differs.

Furthermore, since the data values can be written in an equal time even when the data value is thus varied, the threshold voltage Vth of the memory cell M after the write operation can be checked by a simple verifying method similarly to the case where a binary data is written. Therefore, the write time can be further reduced as a whole.

(3) We then consider a case where the data "11", "10" and "01" are simultaneously written into a plurality of memory cells M1, M2 and M3 connected to an identical word line, e.g., the word line WL1 shown in FIG. 2. In this case, a negative voltage Vcg=−10 V is applied to the word line WL1, the source line SL is opened to put the sources S of the memory cells M1, M2 and M3 into the floating state, and the drain voltages Vd(0)=4.5 V, Vd(1)=3.5 V and Vd(2)=2.5 V obtained by the equation (1) according to the data values "11", "10" and "01" to be written are applied to the bit lines BL1, BL2 and BL3, respectively. The time of voltage application is set to $T_1$=1 msec based on the result shown in FIG. 1A. It is to be noted that the unselected word lines WL0, WL2, ... and the bit lines BL0, BL4 (not shown), ... having no relation with the memory cells M1, M2 and M3 are each made to have 0 V.

By thus discharging electrons from the floating gates FG to the drains D of the memory cells M1, M2 and M3 by the Fowler-Nordheim tunneling method, the threshold voltages Vth of the memory cells M1, M2 and M3 are reduced. By this operation, the threshold voltages Vth of the memory cells M1, M2 and M3 are set to the respective target threshold voltages Vth(0), Vth(1) and Vth(2) according to the data values "11", "10" and "01" to be written.

In a manner as described above, the data values "11", "10" and "01" can be written collectively into the plurality of memory cells M1, M2 and M3 connected to the identical word line WL1. Therefore, the write time can be further reduced as a whole.

Figure 3:
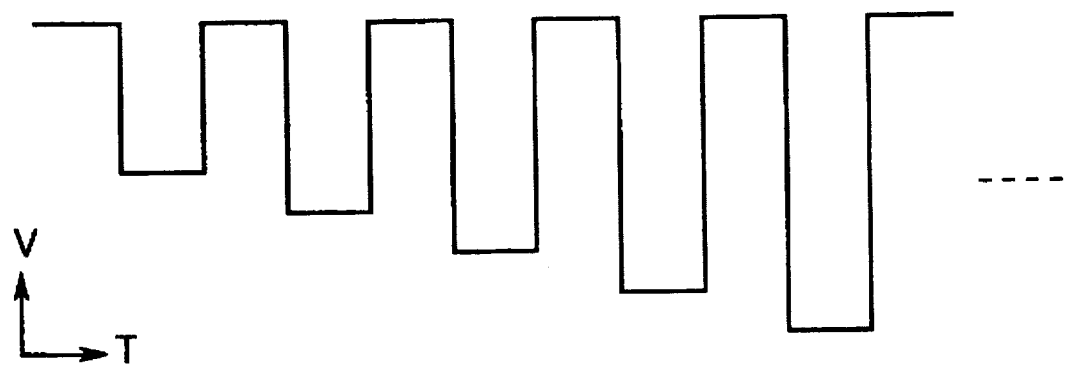
FIG. 3 is a chart showing the waveform of a control gate voltage.

Although the control gate voltage Vcg to be applied to the selected word line WL1 is made constant during the write time in the above embodiment, the present invention is not limited to this. For example, as shown in FIG. 3, the control gate voltage Vcg to be applied to the word line WL1 may be comprised of a plurality of pulses whose level reduces gradually. When this arrangement is adopted, the threshold voltage Vth is verified each time one pulse of the voltage is applied to the word line WL1. When the write operation is insufficient as a consequence of the verify operation, the subsequent pulse having a lower level is applied. When the write operation is executed as desired, the pulse application can be stopped. Therefore, the threshold voltages Vth of the memory cells M can be made to fall within a narrow range with high accuracy in writing multiple value data into the plurality of memory cells M, and the write operation can be executed with fewer times of verify operation, thereby allowing the write time to be further reduced.

Furthermore, the drain voltage is set within the range of Vd=0 to 4.5 V and the control gate voltage is set to Vcg=−10 V in the above embodiment. However, by shifting the drain voltage in parallel with the control gate voltage slightly to a higher side (several volts in the above example), the absolute values of the drain voltage and the control gate voltage can be reduced. Therefore, a voltage reduction can be easily achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for writing a multiple value into a nonvolatile memory comprising the step of: writing data which take not less than three different values as threshold voltages varied according to each of the data values into a memory cell which has a gate insulating film, a floating gate, an interlayer insulating film and a control gate in order on a channel region between a source and a drain formed on a surface of a semiconductor substrate, wherein by applying a drain voltage varied according to each of the data values to the drain so that a write time required for setting the varied threshold voltage is equalized with a specified voltage applied to the control gate, and thereby moving electrons between the floating gate and the drain through the gate insulating film, the threshold voltage of the memory cell is set.

2. A method for writing a multiple value into a nonvolatile memory according to claim 1, wherein the voltage applied to the control gate is a negative voltage, the drain voltage is a positive voltage, and the threshold voltage of the memory cell is set by discharging electrons from the floating gate to the drain through the gate insulating film by a Fowler-Nordheim tunneling method.

3. A method for writing a multiple value into a nonvolatile memory according to claim 2, wherein assuming that a threshold voltage Vth to be set in the memory cell is numbered with n=0, 1, 2, ... in order from a lowest threshold voltage, then a drain voltage Vd(n) when writing data corresponding to the n-th threshold voltage Vth(n) is obtained from the following equation:

$$Vd(n)=Vd(0)-n \cdot \Delta Vth \cdot GCR/(1-DCR) \qquad (1)$$

where $\Delta Vth=Vth(n+1)-Vth(n)$, $GCR=Cono/Ctot$, $DCR=Cd/Ctot$, $Ctot=Cono+Ctd+Cd+Cs$, Cono is an electrostatic capacity between the floating gate and the control gate, Ctd is an electrostatic capacity between the floating gate and the channel region, Cd is an electrostatic capacity between the drain and the floating gate, and Cs is an electrostatic capacity between the source and the floating gate, then by applying a negative voltage to the control gate, putting the source into a floating state, applying a positive drain voltage Vd(n) obtained by the equation (1) according to a data value to be written, and thereby discharging electrons from the floating gate to the drain by the Fowler-Nordheim tunneling method, the threshold voltage Vth(n) of the memory cell is set.

4. A method for writing a multiple value into a nonvolatile memory according to claim 1, wherein the memory cells are arranged in a matrix form on the semiconductor substrate, a word line is connected to the control gates of the memory cells arranged in the direction of row, and a bit line is connected to the drains of the memory cells arranged in the direction of column, and the specified voltage is applied to the word line connected to a plurality of memory cells into which data are to be written out of a plurality of word lines, the drain voltage corresponding to a data value to be written into each of the plurality of memory cells is applied to the bit line connected to the memory cells, thereby writing the data simultaneously into the plurality of memory cells connected to each identical word line.

5. A method for writing a multiple value into a nonvolatile memory according to claim 2, wherein the memory cells are arranged in a matrix form on the semiconductor substrate, a word line is connected to the control gates of the memory cells arranged in the direction of row, and a bit line is connected to the drains of the memory cells arranged in the direction of column, and the negative voltage is applied to the word line connected to a plurality of memory cells into which data are to be written out of a plurality of word lines, the drain voltage corresponding to a data value to be written into each of the plurality of memory cells is applied to the bit line connected to the memory cells, thereby writing the data simultaneously into the plurality of memory cells connected to each identical word line.

6. A method for writing a multiple value into a nonvolatile memory according to claim 2, wherein the negative voltage applied to the control gate is comprised of a plurality of pulses whose voltage level reduces gradually.

7. A method for writing a multiple value into a nonvolatile memory according to claim 3, wherein the negative voltage applied to the control gate is comprised of a plurality of pulses whose voltage level reduces gradually.

8. A method for writing a multiple value into a nonvolatile memory according to claim 4, wherein the negative voltage applied to the word line is comprised of a plurality of pulses whose voltage level reduces gradually.

* * * * *